(12) United States Patent
Hotra et al.

(10) Patent No.: US 11,347,531 B2
(45) Date of Patent: May 31, 2022

(54) GENERALIZED VIRTUALIZATION PLATFORM FOR SYSTEMS USING HARDWARE ABSTRACTION SOFTWARE LAYERS

(71) Applicant: The Boeing Company, Chicago, IL (US)

(72) Inventors: Jonathan N. Hotra, Maryland Heights, MO (US); Antony R. Hunt, Longmont, CO (US)

(73) Assignee: THE BOEING COMPANY, Chicago, IL (US)

( * ) Notice: Subject to any disclaimer, the term of this patent is extended or adjusted under 35 U.S.C. 154(b) by 515 days.

(21) Appl. No.: 16/176,855

(22) Filed: Oct. 31, 2018

(65) Prior Publication Data

US 2020/0133705 A1 Apr. 30, 2020

(51) Int. Cl.
*G06F 12/02* (2006.01)
*G06F 9/455* (2018.01)
*G06F 30/20* (2020.01)

(52) U.S. Cl.
CPC ...... *G06F 9/45558* (2013.01); *G06F 9/45537* (2013.01); *G06F 30/20* (2020.01)

(58) Field of Classification Search
CPC ... G06F 9/45558; G06F 30/20; G06F 9/45537
See application file for complete search history.

(56) References Cited

U.S. PATENT DOCUMENTS 9,696,878 B2 * 7/2017 Zulch, III .............. G01C 23/00
10,579,283 B1 * 3/2020 Chopra ................ G06F 3/0619

(Continued)

FOREIGN PATENT DOCUMENTS

EP 3103014 B1 12/2016

OTHER PUBLICATIONS

Hyunwoo Joe et al., "Full Virtualizing Micro Hypervisor for Spacecraft Flight Computer," Digital Avionics Systems Conference, 2012 IEEE/AIAA 31st, IEEE, Oct. 14, 2012, pp. 6C5-1 through 6c5-9.

(Continued)

*Primary Examiner* — Doon Y Chow
*Assistant Examiner* — Abdou K Seye
(74) *Attorney, Agent, or Firm* — MH2 Technology Law Group LLP (57) ABSTRACT

Techniques for testing a physical hardware system by executing hardware system application software on a corresponding emulated proxy physical hardware system in a proxy virtual machine are presented. The techniques include: obtaining a proxy physical hardware system that matches aspects of the physical hardware system; constructing, in a virtualization system, the proxy virtual machine; emulating, using the virtualization system, hardware components of the proxy physical hardware system in the proxy virtual machine; executing a hardware abstraction software layer in the proxy virtual machine; executing, by the hardware abstraction software layer of the virtualization system, the hardware system application software in the proxy virtual machine on the proxy physical hardware system using a memory map at least one adapter; and testing, using the virtualization system, the physical hardware system by the executing the hardware system application software in the proxy virtual machine on the proxy physical hardware system.

23 Claims, 9 Drawing Sheets

(56) References Cited

U.S. PATENT DOCUMENTS

| | | | |
|---|---|---|---|
| 2010/0165874 A1* | 7/2010 | Brown | G06F 13/4022 |
| | | | 370/254 |
| 2013/0166271 A1* | 6/2013 | Danielsson | G06F 30/20 |
| | | | 703/22 |
| 2014/0250437 A1* | 9/2014 | Ginzton | G06F 9/455 |
| | | | 718/1 |
| 2020/0026428 A1* | 1/2020 | Vithalkar | G06F 3/0664 |

OTHER PUBLICATIONS

Vanderleest et al., "ARINC 653 Hypervisor," Digital Avionics Systems Conference (DASC), 2010 IEEE/AIAA 29th, IEEE, Oct. 3, 2010, pp. 5.E.2-1 through 5.E.2-20.

Extended European Search Report dated Feb. 24, 2020 in corresponding European Application No. 19193127.8, 12 pages.

Lanches, Philippe (EP Examiner), Communication pursuant to Article 94(3) EPC dated Oct. 25, 2021 in corresponding European Patent Application No. 19193127.8, 7 pages.

* cited by examiner

GENERALIZED VIRTUALIZATION PLATFORM FOR SYSTEMS USING HARDWARE ABSTRACTION SOFTWARE LAYERS

FIELD

This disclosure relates to modeling and virtualization. In particular, the present disclosure provides for high fidelity emulation of special-purpose hardware systems through the use of a hardware abstraction software layer.

BACKGROUND

During engineering, development, and testing of complex electronic systems and devices, physical hardware and its specifications can be a limited resource. As such, developers (e.g., scientists, engineers, software developers, and testers) involved in the development of such systems may not have access to the physical hardware until very late in the development of the systems and devices. For example, there is often a significant amount of product development time between when the specification and design of a hardware system is complete and when the first early versions of the hardware system are available for development and testing.

With knowledge of the physical hardware's specifications, the limited availability of the physical hardware itself can sometimes be addressed using a virtualization platform, which may be an embedded computing device (e.g., an avionics computer) on which the software of the physical hardware is executed. However, the use of such a virtualization platform requires at least knowledge of the specifications of the physical hardware, if not actual access. Such physical hardware specifications may not be readily available to allow for the construction of virtualization platforms. For example, hardware suppliers are sometimes reluctant to provide the necessary hardware details due to intellectual property concerns, or simply because they are not contractually obligated to provide this information. It is sometimes possible to negotiate the release of the necessary hardware information, but this can take months and often comes with restrictive costs and licensing considerations.

SUMMARY

According to various embodiments, a method of testing a physical hardware system by executing hardware system application software on a corresponding emulated proxy physical hardware system in a proxy virtual machine is presented. The method includes: obtaining a proxy physical hardware system that matches aspects of the physical hardware system; constructing, in a virtualization system, the proxy virtual machine from the proxy physical hardware system; emulating, using the virtualization system, hardware components of the proxy physical hardware system in the proxy virtual machine; executing a hardware abstraction software layer in the proxy virtual machine; executing, by the hardware abstraction software layer of the virtualization system, the hardware system application software in the proxy virtual machine on the proxy physical hardware system using a memory map that reproduces memory locations used by the proxy physical hardware system and using at least one adapter that maps data between the proxy virtual machine and the hardware system application software; and testing, using the virtualization system, the physical hardware system by the executing the hardware system application software in the proxy virtual machine on the proxy physical hardware system.

Various optional features of the above embodiments include the following. The hardware abstraction software layer may include an ARINC 653 operating system. The at least one adapter may execute in the hardware abstraction software layer. The at least one adapter may execute in the proxy virtual machine. The at least one adapter may include a first adapter that executes in the software abstraction layer and a second adapter that executes in the proxy virtual machine. The physical hardware system may include an avionics system including a plurality of line replaceable units. The method may include modifying the physical hardware system based on the testing to produce a modified physical hardware system; and deploying the modified physical hardware system. The obtaining the proxy physical hardware system that matches the physical hardware system may include obtaining a proxy physical hardware system that has at least a same processor as a processor of the physical hardware system. The constructing, in the virtualization system, the proxy virtual machine from the proxy physical hardware system may include emulating at least a processor of the proxy physical hardware system. The obtaining the proxy physical hardware system that matches the physical hardware system may proceed without access to a specification of the physical hardware system. The method may include simulating at least one vehicle physical hardware system using the virtualization system to train users of the vehicle physical hardware system.

According to various embodiments, a system for testing a physical hardware system by executing hardware system application software on a corresponding emulated proxy physical hardware system in a proxy virtual machine is presented. The system includes: a proxy physical hardware system that matches aspects of the physical hardware system; and a virtualization system including a proxy virtual machine constructed from the proxy physical hardware system, where the proxy virtual machine emulates hardware components of the proxy physical hardware system and executes a hardware abstraction software layer that executes the hardware system application software in the proxy virtual machine using a memory map that reproduces memory locations used by the proxy physical hardware system and using at least one adapter that maps data between the proxy virtual machine and the hardware system application software.

Various optional features of the above embodiments include the following. The hardware abstraction software layer may include an ARINC 653 operating system. The at least one adapter may execute in the hardware abstraction software layer. The at least one adapter may execute in the proxy virtual machine. The at least one adapter may include a first adapter that executes in the software abstraction layer and a second adapter that executes in the proxy virtual machine. The physical hardware system may include an avionics system including a plurality of line replaceable units. The system may include a modified physical hardware system modified based on testing the physical hardware system using the virtualization system. The proxy physical hardware system may have at least a same processor as a processor of the physical hardware system. The proxy virtual machine constructed from the proxy physical hardware system may emulate at least a processor of the proxy physical hardware system.

According to various embodiments, a method of training a person to operate a physical hardware system by training the person to operate executing hardware system application software on an emulated proxy physical hardware system in a proxy virtual machine, the emulated proxy physical hardware system corresponding to the physical hardware system, is presented. The method includes: obtaining a proxy physical hardware system that matches aspects of the physical hardware system; constructing, in a virtualization system, the proxy virtual machine from the proxy physical hardware system; emulating, using the virtualization system, hardware components of the proxy physical hardware system in the proxy virtual machine; executing a hardware abstraction software layer in the proxy virtual machine; executing, by the hardware abstraction software layer of the virtualization system, the hardware system application software in the proxy virtual machine on the proxy physical hardware system using a memory map that reproduces memory locations used by the proxy physical hardware system and using at least one adapter that maps data between the proxy virtual machine and the hardware system application software; and training the person, using the virtualization system, to operate the physical hardware system by training the person to operate the executing the hardware system application software in the proxy virtual machine on the proxy physical hardware system.

Various optional features of the above embodiments include the following. The physical hardware system may include a vehicle physical hardware system. The vehicle may include an aircraft, and the virtualization system may include a flight simulator.

BRIEF DESCRIPTION OF THE DRAWINGS

The accompanying drawings, which are incorporated in and constitute a part of this specification, illustrate the present teachings and together with the description, serve to explain the principles of the disclosure.

It should be noted that some details of the figures have been simplified and are drawn to facilitate understanding of the present teachings, rather than to maintain strict structural accuracy, detail, and scale.

DETAILED DESCRIPTION

Reference will now be made in detail to the disclosed examples, which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific examples. These examples are described in sufficient detail to enable those skilled in the art to practice them and it is to be understood that other examples may be utilized and that changes may be made without departing from the scope of the disclosure. The following description is, therefore, merely exemplary.

In a typical virtual machine construction to emulate physical hardware and to execute physical hardware software applications (e.g., executable software) on the virtual machine, many details about the hardware for a specific platform must be known: memory map, interrupts table, firmware registers, etc. However, hardware abstraction software layers, such the Aeronautical Radio, Incorporated (ARINC) 653 standard architecture (of Annapolis, Md., USA—Formerly Rockwell Collins), abstract most details of the underlying hardware platform on which software applications of the physical hardware run. In particular, some embodiments utilize a hardware abstraction software layer, e.g., provided by ARINC 653, to create a single generalized virtualization platform that works for many different platforms. Such embodiments may be used to develop and test, for example, avionics line replaceable units (LRUs) and other special-purpose hardware devices. In particular, software applications may be executed, sometimes as unmodified binaries, on the virtualization platform according to some embodiments.

To avoid the need for hardware access or hardware specification access, some embodiments substitute proxy physical hardware for the emulated hardware. In such embodiments, a proxy hardware system that is to be emulated is selected to match aspects of the actual hardware system. The use of such a proxy hardware system avoids the need for hardware access or knowledge of its specifications. This, in part, permits some embodiments to provide a generalized virtualization platform that allows software applications to run unmodified in a virtual machine without knowledge of most of the details of the physical hardware.

Embodiments provide many advantages. For example, the creation of a generalized virtualization platform allows for cost savings by avoiding the construction of multiple virtual platforms. As another example, some embodiments provide virtual platforms very early in the product development, thus enabling early development and testing activities of the physical platform and its software applications. Early use of virtualization platforms, in turn, allows for the discovery of design defects early in product development. Such early problem discovery provides significant cost savings. If a problem is detected in lab test versus flight test, an order of magnitude cost savings can be realized. Likewise, if a problem is detected in requirements/design, versus lab test, then another order of magnitude cost savings can be realized. Thus, some embodiments provide for problem discovery in the requirements/design phase of a program, which allows for two orders of magnitude cost savings to be realized.

Further, embodiments may be used to create high fidelity trainers, such as flight crew trainers and maintenance trainers. Such embodiments provide the same ease of construction, reuse across platforms, and removes the need to reverse engineer hardware, e.g., for trainer constructions.

In sum, some embodiments simplify the creation of generalized virtual machines and virtualization platforms. Some embodiments provide virtual machines for the corresponding hardware platforms for which detailed hardware information is unknown, without having to resort to time consuming reverse engineering activities. Some embodiments allow for the development of such virtualization platforms early in the product development cycle. These and other advantages are presented in detail herein.

Figure 1:
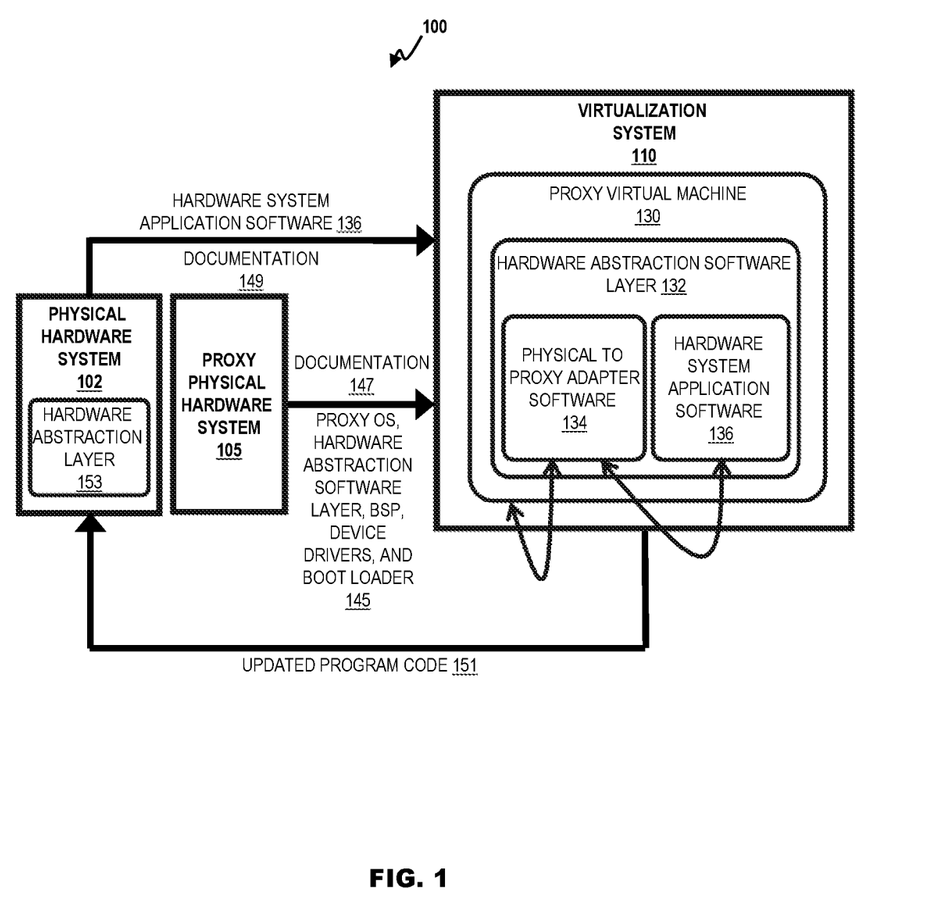
FIG. 1 shows a system block diagram illustrating an example of an environment, with a physical to proxy adapter executing in a hardware abstraction software layer, for implementing systems and processes in accordance with aspects of the present disclosure.

FIG. 1 shows a system block diagram illustrating an example of an environment 100, with physical to proxy adapter software 134 executing in hardware abstraction software layer 132, for implementing systems and processes in accordance with aspects of the present disclosure. Environment 100 can include a physical hardware system 102, a proxy physical hardware system 105, and a virtualization system 110. The physical hardware system 102 can be comprised of one or more computer-implemented hardware components and one or more communication channels. For example, the physical hardware system 102 can be an avionics LRU, such a mission computer, a navigation unit, a communication unit, an engine management unit, a crew interface unit, a threat detection unit, electronic countermeasures unit, stores management unit, an industrial control unit, or the like. Additionally, for example, the physical hardware system 102 can be an integrated avionics unit comprised of one or more modules incorporating the functionality of some or all of the above avionics units.

While FIG. 1 is described above as an existing physical hardware system 102, it is understood that the physical hardware system 102 can be a new system that is under development and, therefore, not yet fully implemented or produced. In implementations, the physical hardware system 102 can be a pre-prototype unit comprised of partially implemented in software and/or hardware. For example, the physical hardware system 102 can be software executing by a temporary computing device (e.g., a breadboard system, a test bed system, and/or commercial-off-the-shelf system).

The proxy physical hardware system 105 is selected to match aspects of the physical hardware system 102. Such a proxy physical hardware system 105 may match the physical hardware system according to various criteria presented herein. The proxy physical hardware system 105 may support a software abstraction layer, such as ARINC 653. Additionally, the proxy physical hardware system 105 may have the same processor and input/output types as the physical hardware system 102. Further, for proxy physical hardware systems 105 that include ARINC 653, the proxy physical hardware system 105 may further have a readily available ARINC 653 Board Support Package (BSP). Thus, the physical proxy hardware system 105 matches aspects of the physical hardware system 102 if it at least supports a software abstraction layer. Additional matching criteria may include any, or a combination, of having the same processor type, having the same input/output type, and having a BSP.

As a specific example, an embodiment may utilize a SBC612 provided by Abaco Systems, which is a Commercial Off The Shelf (COTS) Single Board Computer (SBC). The SBC612 has a PowerPC P4080 processor and an already built Wind River VxWorks ARINC 653 BSP similar to that of some embodiments of the physical hardware system 102.

The virtualization system 110 can be a computing system comprised of hardware and software that can emulate other devices. In implementations, the virtualization system 110 can be one or more general purpose computers, such as a server or a desktop computer that hosts one or more proxy virtual machines 130 that emulate physical hardware systems, such as the proxy physical hardware system 105, as well as their hardware and software interfaces (e.g., peripherals, data links, interrupt behavior, and timing requirements). Additionally, the proxy virtual machine 130 executes hardware system application software 136 (e.g., a software executable running in a partition) that is, an exact or substantially exact copy (e.g., an image) of the hardware system application software executed by the physical hardware system 102. In implementations, the virtualization system 110 can include, e.g., a hypervisor or virtual machine monitor software. For example, the virtualization system 110 can use QUICK EMULATOR ("QEMU"), which is an open source software application that performs hardware virtualization.

The proxy virtual machine 130 can be an emulation of the proxy physical hardware system 105 within the virtualization system 110. Information for creating the virtual machine 130 can be obtained from the proxy physical hardware system 105 and from hardware system application software 136 and documentation 147 describing the proxy physical hardware system 105. For example, the hardware system application software 136 can be the application code for the physical hardware system 102 (e.g., an avionics LRU). The hardware system application software 136 can also include the source code (e.g., application logic), interface code (e.g., timing and formatting), and/or interrupt logic of hardware components and the communication links included in the physical hardware system 102. Proxy operating system, hardware abstraction software layer, BSP, device drivers, and boot loader 145 will replace like functionality on proxy physical hardware system. Physical to Adapter Proxy Software 134 is used to accomplish this replacement without modification of the hardware system application software 136. The proxy hardware system documentation 147 can be information defining operational requirements and operating details of the hardware components and the communication links of the proxy physical hardware system 105. For example, the documentation 147 can be technical specifications and infrastructure software. Any available physical hardware system documentation 149 may also be useful in proxy virtual machine construction. However, documentation 149 is often limited in scope or not available in proxy virtual machine scenarios.

Hardware abstraction software layer 132 is identical or similar to the hardware abstraction software layer 153 found on proxy physical hardware system 105. As shown in FIG. 1, physical to proxy adapter software 134 executes in a hardware abstraction software layer 132, which may be ARINC 653, of the proxy virtual machine 130. The physical to proxy adapter software 134 adapts differences in the physical hardware system 102 as compared to the proxy physical hardware system 105. In particular, the physical to proxy adapter software 134 maps input/output data between the hardware system application software 136 and the proxy virtual machine 130. For embodiments in which the hardware abstraction software layer 132 is an ARINC 653 operating system, the physical to proxy adapter software 134 may map internal ARINC 653 input/output messages generated and received from the hardware system application software 136 to virtual input/output in the proxy virtual machine 130.

The proxy virtual machine 130 can be used for engineering, development and testing of the physical hardware system 102 before, during, and after its production. For example, prior to actual production of the physical hardware system 102, the proxy physical hardware system 105 may be emulated by the proxy virtual machine 130 to develop and debug pre-production software expected to be implemented in the physical hardware system 102. As such, development and testing of the hardware and software can occur in parallel. Additionally, during development of the physical hardware system 102 when few, if any, physical hardware units are available, developers can work with the proxy virtual machine 130 instead. Because the proxy virtual machine 130 substantially matches the physical hardware system 102, each developer involved in the development and production of the physical hardware system 102 can implement a copy of the proxy virtual machine 130 at their respective workstations (e.g., a respective virtualization system 110). The high-fidelity emulation provided by the proxy virtual machine 130 allows for problems to be caught early and will provide considerable cost savings during development. Updated program code 151 implemented in the proxy virtual machine 130 can be fed back into the physical hardware system 102, when available, to increase the rate of development. Further, after the physical hardware system 102 is fielded, the proxy virtual machine 130 can be used to support, test, and update the physical hardware system 102. For example, in an aircraft accident investigation, the particular build of software used in the aircraft can be imaged (e.g., as hardware system application software 136) and executed in the proxy virtual machine 130 using the virtualization system 110. Further, the proxy virtual machine 130 may be used for trainers, e.g., in a flight simulation system.

Figure 2:
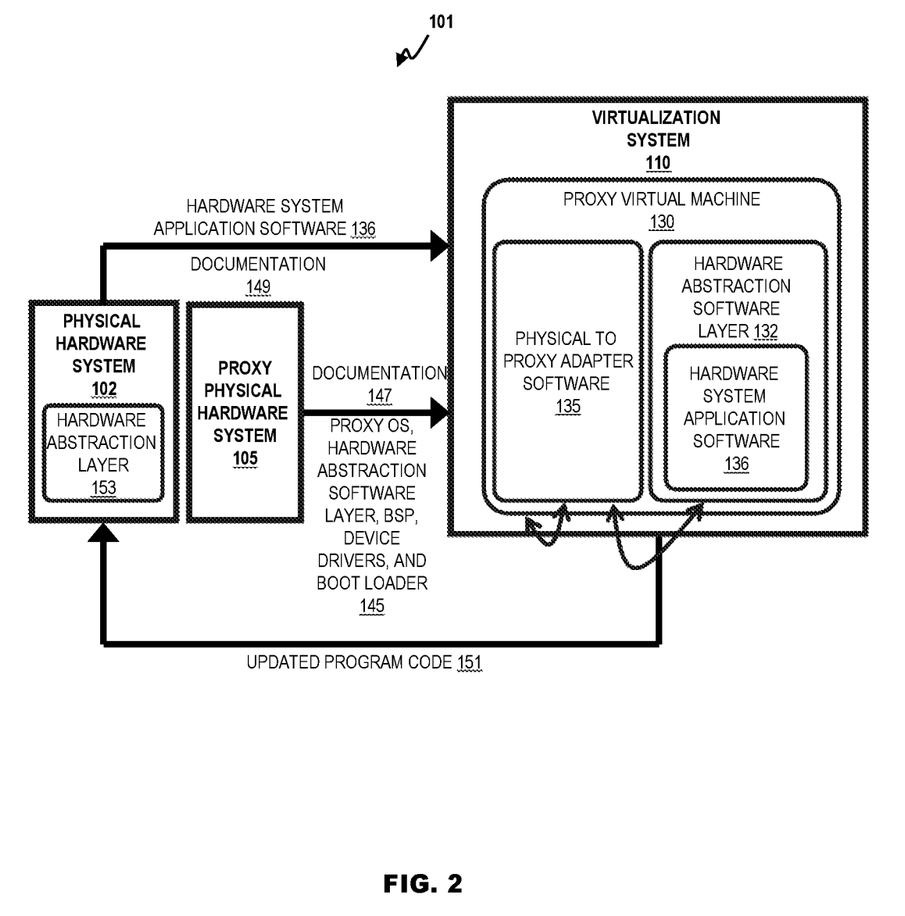
FIG. 2 shows a system block diagram illustrating an example of an environment, with a physical to proxy adapter in the proxy virtual machine layer, for implementing systems and processes in accordance with aspects of the present disclosure.

FIG. 2 shows a system block diagram illustrating an example of an environment 101, with physical to proxy adapter software 135 executing in the proxy virtual machine 130 layer, for implementing systems and processes in accordance with aspects of the present disclosure. Like the physical to proxy adapter software 134 of FIG. 1, the physical to proxy adapter software 135 of FIG. 2 adapts differences in the physical hardware system 102 as compared to the proxy physical hardware system 105. Just like proxy adapter software 134 of FIG. 1, the proxy adapter software 135 maps input/output data between the hardware system application software 136 and the proxy virtual machine 130. Because proxy adapter software 135 is implemented in the virtualization layer of proxy virtual machine 130, the adapter can be used to deal with differences in operating system and hardware behavior that is not possible with proxy adapter software 134 in the Hardware Abstraction Layer 132. Such difference may include message format differences, e.g., message field arrangement and/or content, substituting and stubbing codes sections, rerouting hardware device accesses to comparable emulated hardware devices, e.g. timers. This may be performed to reconcile differences between physical hardware system 102 and proxy hardware system 105 with physical hardware and possible hardware abstraction software layer and OS differences in order to get hardware system software application 136 to run unmodified or with limited modifications on proxy hardware system 105

The physical to proxy adapter software 135 may take various forms. As one example, it may be a dummy hardware device in the virtualization layer that driver software interacts with to send input/output data. As another example, it may watch emulated instruction execution to determine when input/output is attempted, and then intercept those calls and send them out the virtual input/output of the virtual machine and generate appropriate responses to satisfy the application layer software that the transmission/reception succeeded.

Note that some embodiments may include both physical to proxy adapter software 134 executing in the hardware abstraction software layer 132 as shown and described in reference to FIG. 1, and physical to proxy adapter software 135 executing in the proxy virtual machine 130 layer as shown and described in reference to FIG. 2. In such embodiments, the physical to proxy adapter software 134 executing in the hardware abstraction software layer 132 may map input/output messages, whereas the physical to proxy adapter software 135 executing in the proxy virtual machine 130 layer may translate messages intended for different hardware abstraction layer software implementations, 132 as described above in reference to FIG. 2.

Figure 3:
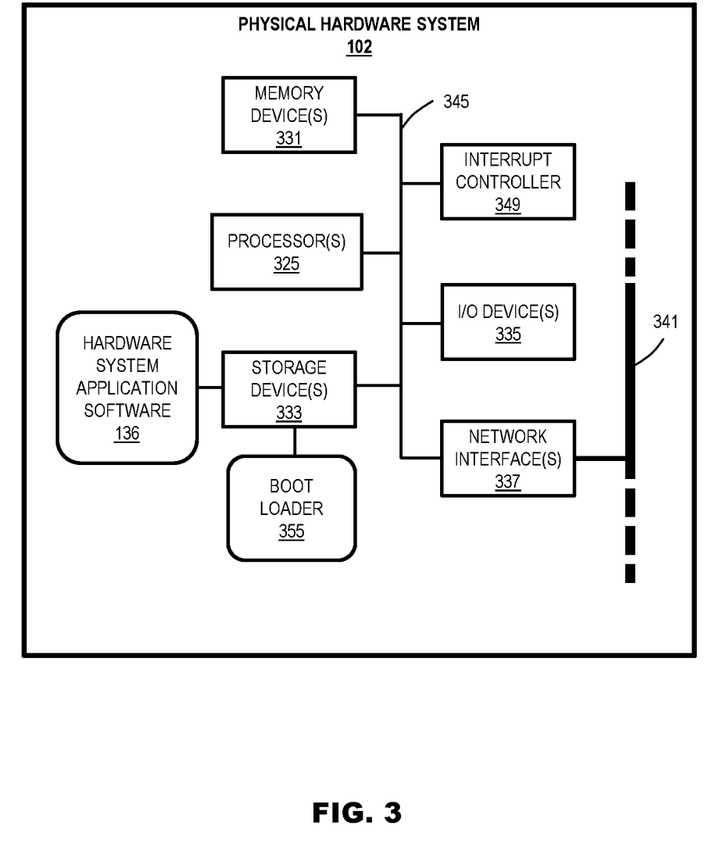
FIG. 3 shows a system block diagram illustrating an example of a physical hardware system in accordance with aspects of the present disclosure.

FIG. 3 shows a system block diagram illustrating an example of a physical hardware system 102 in accordance with aspects of the present disclosure. The physical hardware system 102 can be the same or similar to that previously described.

The physical hardware system 102 can comprise any type of computing system including a general and/or specific purpose hardware capable of executing computer program instructions installed thereon (e.g., a personal computer, server, application-specific computing device, etc.). It is understood that the physical hardware system 102 is only representative of various possible equivalent-computing devices. To this extent, in embodiments, the functionality provided by the physical hardware system 102 can be any combination of general and/or specific purpose hardware and/or computer program instructions used for a variety of applications (e.g., industrial control and/or automation). In implementations, the physical hardware system 102 can be special-purpose device, such as an avionics LRU.

The physical hardware system 102 can be comprised of various components, including one or more processors 325, one or more memory devices 331, one or more storage devices 333 (e.g. memory devices, or storage system), one or more input/output devices 335 (I/O devices), and one or more network interfaces 337 (e.g. network interface devices). The processors 325 can include a microprocessor, a microchip, and/or an application-specific integrated circuit. The memory devices 331 can include one or more of a local storage, such as random access memory (RAM) and a cache memory, employed during execution of program instructions. The storage devices 333 can comprise a computer-readable, non-volatile hardware devices that stores information and program instructions. For example, the storage devices 333 can be one or more flash drives, non-volatile memory and/or hard disk drives. The input/output devices 335 can include any device that enables an individual to interact with the physical hardware system 102 (e.g., a user interface) and/or any device that enables the physical hardware system 102 to communicate with one or more other computing devices using any type of communications link. The input/output device 335 can be, for example, a touchscreen display, pointer device, keyboard, etc. The network interface 337 can include any transceiver device configured to send and receive data via a network communication link, such as systems communication bus 341.

Additionally, the physical hardware system 102 can include one or more communication channels 345 (e.g., a data bus) through which the processors 325, memory devices 331, storage devices 333, input/output devices 335, and network interface devices 337 can communicate. Further, the physical hardware system 102 can include an interrupt controller 349 which can be a programmable device used to manage communications of the processors 325, the memory devices 331, the storage devices 333, the input/output devices 335, and/or the network interface devices 337 on to the communication channel 345, including allowing priority levels to be assigned to its interrupts.

The processor 325 executes computer program instructions (e.g., an operating system and/or application programs), which can be stored in the memory device 331 and/or storage devices 333. For example, one or more processor(s) 325 can execute program instructions of a boot loader 355 and hardware system application software 136. The boot loader 355 can comprise program instructions that initiate operation of the physical hardware system 102 by loading its operating system. The hardware system application software 136 can include application-specific program instructions (e.g., avionics software).

Figure 4:
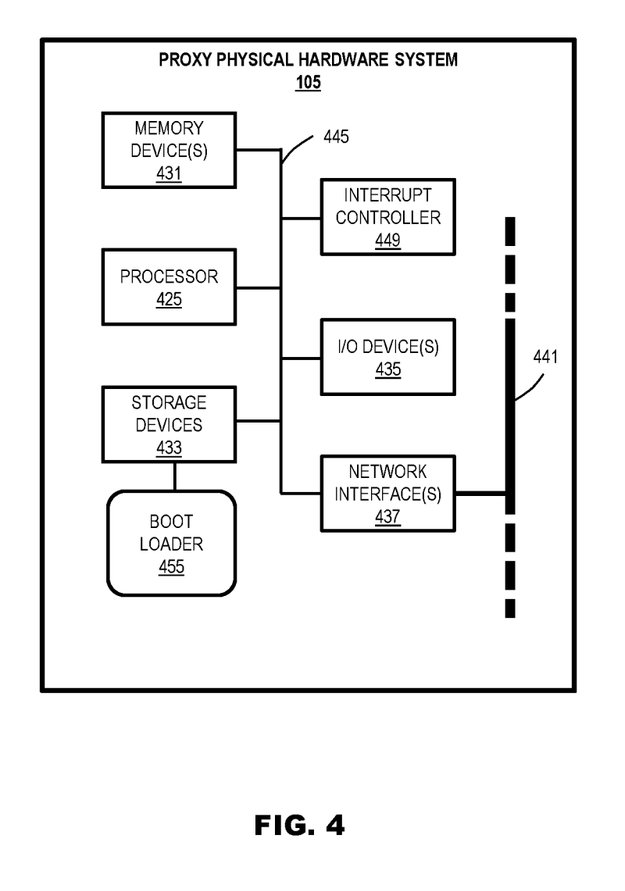
FIG. 4 shows a system block diagram illustrating an example of a proxy physical hardware system in accordance with aspects of the present disclosure.

FIG. 4 shows a system block diagram illustrating an example of a proxy physical hardware system 105 in accordance with aspects of the present disclosure. The proxy physical hardware system 105 is selected to match aspects of a physical hardware system, e.g., physical hardware system 102, according to specified criteria. Such criteria may include any, or a combination, of supporting the same (or similar) hardware abstraction software layer 153, having the same processor type, having the same input/output type, and having a BSP, device drivers, and a boot loader. Thus, proxy physical hardware system 105 includes one or more processors 425, which may be the same as processor 325 of physical hardware system 102, one or more memory devices 431 (which may be the same or different from memory devices 331), one or more storage devices 433 (which may be the same or different from storage devices 333), one or more input/output devices 435 (which may be the same or different from input/output devices 335), and one or more network interface devices 437 (which may be the same or different from network interface devices 337). As in the physical hardware system 102, the proxy physical hardware system 105 can include one or more communication channels 445 (which may be the same or different from communication channels 345), an interrupt controller 449 (which may be the same or different from interrupt controller 349), and a boot loader 455 (which may be the same or different from boot loader 355). As used herein, processor 425, memory devices 431, storage devices 433, input/output devices 435, network interface device 437, communication channels 445, and interrupt controller 449 are examples of hardware components. With some modifications to the hardware system application software 136 of physical hardware system 102, the hardware system application software 136 may run on proxy physical hardware system 105. The proxy physical hardware system 105 is selected to include hardware that may be emulated by virtual hardware (e.g., proxy virtual machine 130) using a virtualization system (e.g., virtualization system 110). The proxy physical hardware system 105 selection and proxy virtual machine 130 creation is done to support the hardware system application software 136 execution on proxy virtual machine 130 with little or no modification to the hardware system application software 136 in accordance with aspects of the present disclosure.

Figure 5:
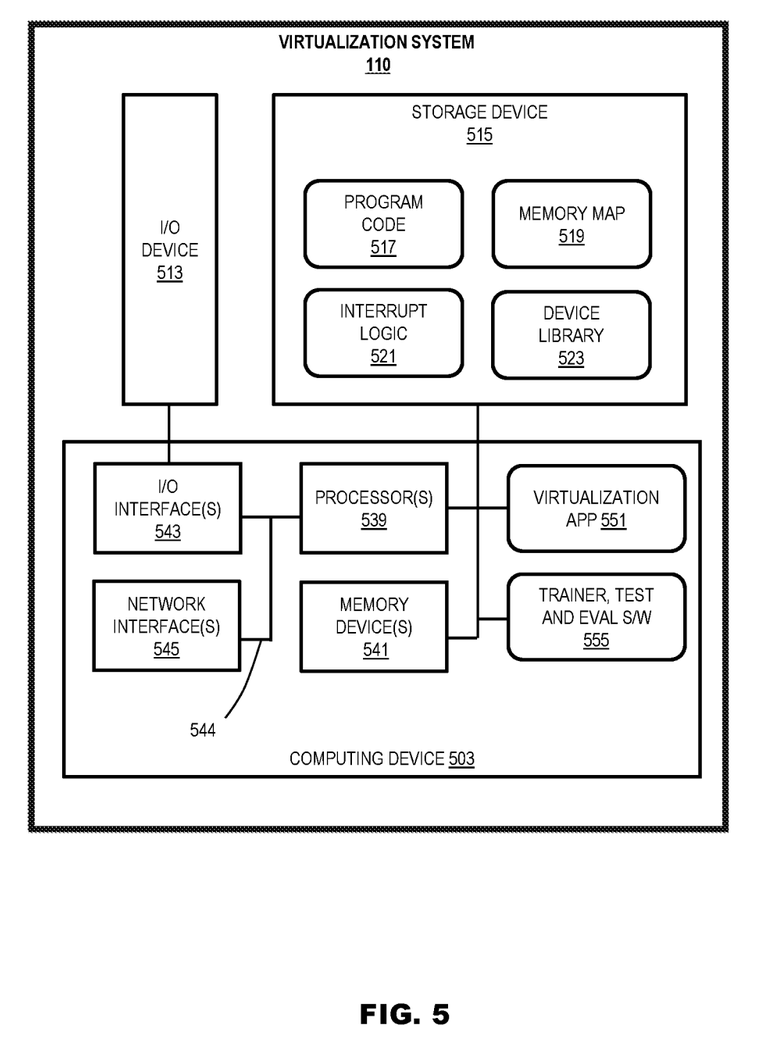
FIG. 5 shows a system block diagram illustrating an example of a virtualization system in accordance with aspects of the present disclosure.

FIG. 5 shows a system block diagram illustrating an example of a virtualization system 110, which can be the same or similar to that described above (e.g., virtualization system 110 of FIGS. 1 and/or 2). The virtualization system 110 includes hardware and software that perform the processes and functions disclosed herein. The virtualization system 110 can comprise any type of computing system including a combination of general and/or specific purpose hardware capable of executing computer program instructions installed thereon to perform the disclosed techniques.

The virtualization system 110 includes a computing device 503, an input/output (input/output) device 513, and a storage device 515. The input/output device 513 can include any device that enables an individual to interact with the computing device 503 (e.g., a user interface) and/or any device that enables the computing device 503 to communicate with one or more other computing devices using any type of communications link. The input/output device 513 can be, for example, a touchscreen display, pointer device, keyboard, etc.

The storage device 515 can comprise a computer-readable, non-volatile hardware storage device that stores information and program instructions. For example, the storage device 515 can be one or more flash drives and/or hard disk drives. In accordance with aspects of the present disclosure, the storage device 515 can store hardware system program code (e.g. hardware system application software 136), one or more memory maps 519 of the proxy physical hardware system 105, interrupt logic 521, and a device library 523. The hardware system application software 136 can be application software of the physical hardware system (e.g., physical hardware system 102). In implementations, the program code substantially mirrors that of the physical hardware system 102. The memory map 519 describes connections between components of the physical hardware systems from a memory interface perspective. In implementations, the memory map 519 comprises information defining locations of memory blocks of the hardware components in the memory 431 of the proxy hardware system 105. For example, the memory map 519 can represent locations of information for memory registers of hardware components of the proxy physical hardware system 105 as an offset from a starting memory address. The interrupt logic 521 can be information describing the interrupt functionality of the physical hardware system, as detailed below. The device library 523 can be a repository of computer-readable information and instructions describing emulations of one or more physical hardware systems (e.g., proxy physical hardware system 105), which may have been previously been created and stored for future use.

In embodiments, the computing device 503 includes one or more processors 539 (e.g., microprocessor, microchip, or application-specific integrated circuit), one or more memory devices 541 (e.g., RAM, read-only memory (ROM)), one or more input/output interfaces 543, and one or more network interface devices 545. The memory devices 541 can include a local memory (e.g., a random access memory and a cache memory) employed during execution of program instructions. Additionally, the computing device 503 includes at least one communication channel 544 (e.g., a data bus) by which it communicates with the input/output device 513 and the storage device 515. The processor 539 executes computer program instructions (e.g., an operating system and/or application programs), which can be stored in the memory device 541 and/or storage device 515.

The processor 539 can also execute computer program instructions of a virtualization application 551 (e.g., QEMU) and trainer, test and/or evaluation software 555. The virtualization application 551 can be the same or similar to that previously described. For example, the virtualization application 551 can include a hypervisor or virtual machine monitor software. In accordance with aspects of the present disclosure, the virtualization application 551 can provide a virtual machine (e.g., proxy virtual machine 130) using the program code 517, the memory map 519, the interrupt logic 521, and/or the device library 523.

The trainer, test and/or evaluation software 555 can be an application or program including computer-readable instructions and information configured to test, evaluate, and/or validate software. For example, trainer, test and/or evaluation software 555 can execute test routines that verify program code of a hardware device behaves as expected in response to a predetermined scenario. Additionally, the trainer, test and/or evaluation software 555 can execute cybersecurity routines that test attack vectors of malicious software. For example, the trainer, test and/or evaluation software 555 can record complete state (registers, memory, hardware states, etc.) of a virtual machine as instructions execute to allow observation and analysis of a compromised system. The trainer, test and/or evaluation software 555 can be used to provide a trainer for users of physical system 102 (e.g. flight crew or maintenance trainers).

It is noted that the computing device 503 is representative of various possible equivalent-computing devices that can perform the processes described herein. To this extent, in embodiments, the functionality provided by the computing device 503 can be any combination of general and/or specific purpose hardware and/or computer program instructions. In the disclosed embodiments, the program instructions and hardware can be created using standard programming and engineering techniques, respectively.

Figure 6:
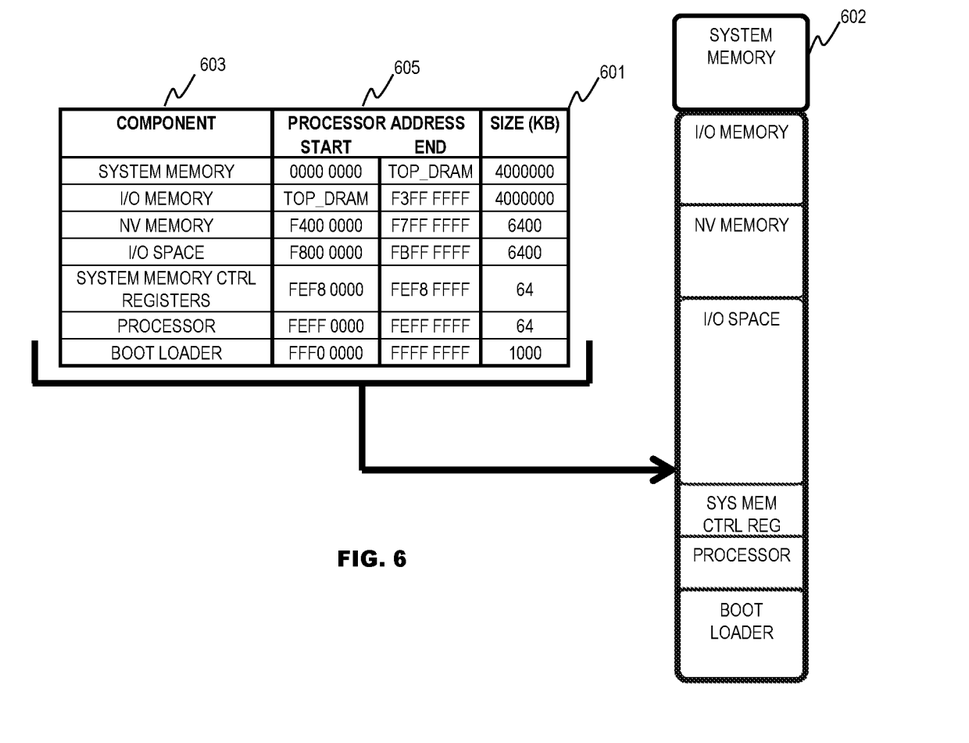
FIG. 6 shows an example of a memory map in accordance with an embodiment of the present disclosure.

FIG. 6 illustrates an example of a memory map 601 and an address space 602 of a virtualization system in accordance with implementations of the present disclosure. The memory map 601 associates the memory addresses for hardware components 603 of a physical hardware system (e.g., proxy physical hardware system 105) and memory locations 605 (e.g., memory blocks of memory device 541) of the virtualization system (e.g., virtualization system 110). The information comprising the memory map 601 can be exacted from documentation (e.g., documentation 147) of the proxy physical hardware system 105. The address space 602 for the virtualization machine (e.g., proxy virtual machine 130) can be a memory construct generated based on the memory map 601. For example, the address space 602 can include register memory addresses and ranges corresponding to locations of the emulated components (e.g., components of the proxy physical hardware system 105) within the virtualization system. In implementations, there may be three kinds of memory typically found in a memory map: volatile memory (e.g., RAM), non-volatile memory (e.g. flash), and memory mapped input/output. The volatile memory can be used, for example, to retrieve and store information during software execution. The non-volatile memory (e.g. NV memory) can be used, for example, to store software instructions for execution and configuration information. The memory mapped input/output can be used to exchange information between hardware components, which can illicit behaviors and responses of the hardware components.

Figure 7:
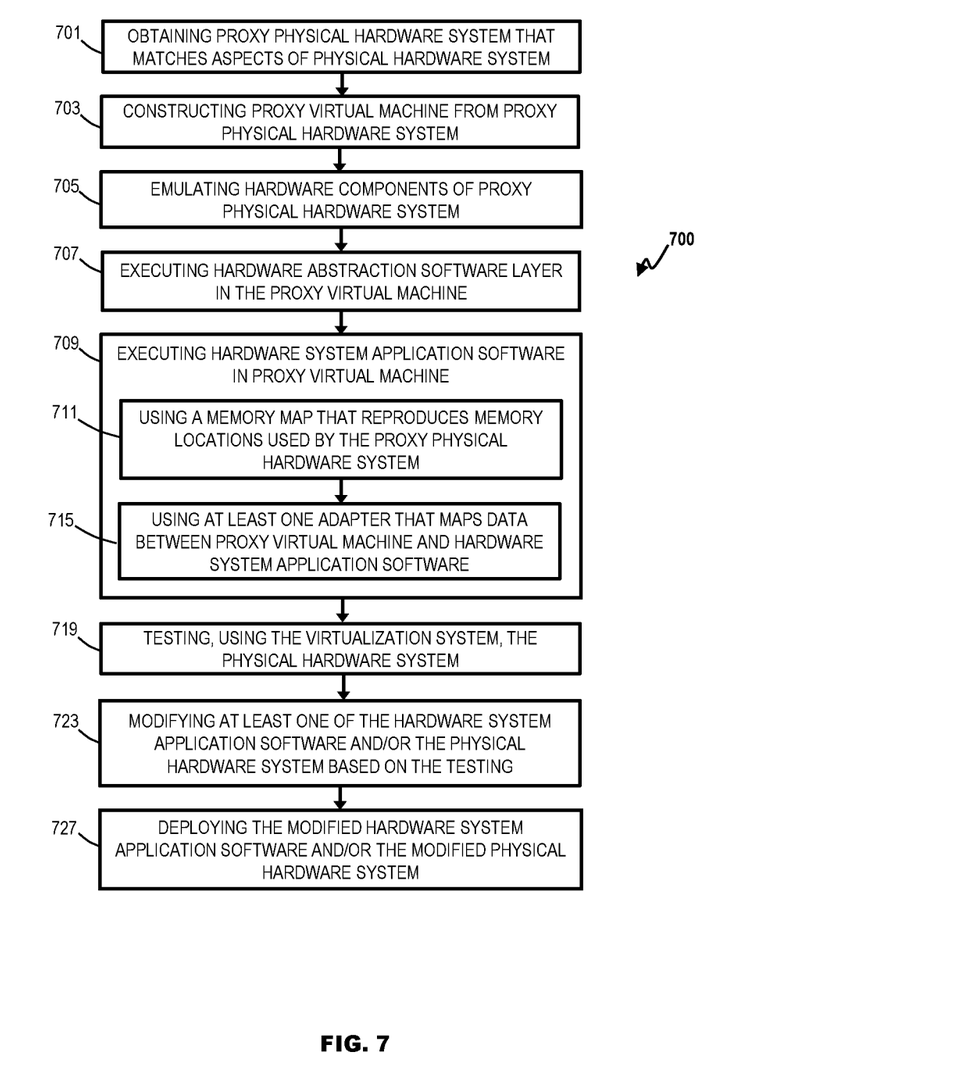
FIG. 7 illustrates a process flow diagram of an exemplary process 700 for testing a physical hardware system by executing hardware system application software on a corresponding emulated proxy physical hardware system in a proxy virtual machine.
Figure 8:
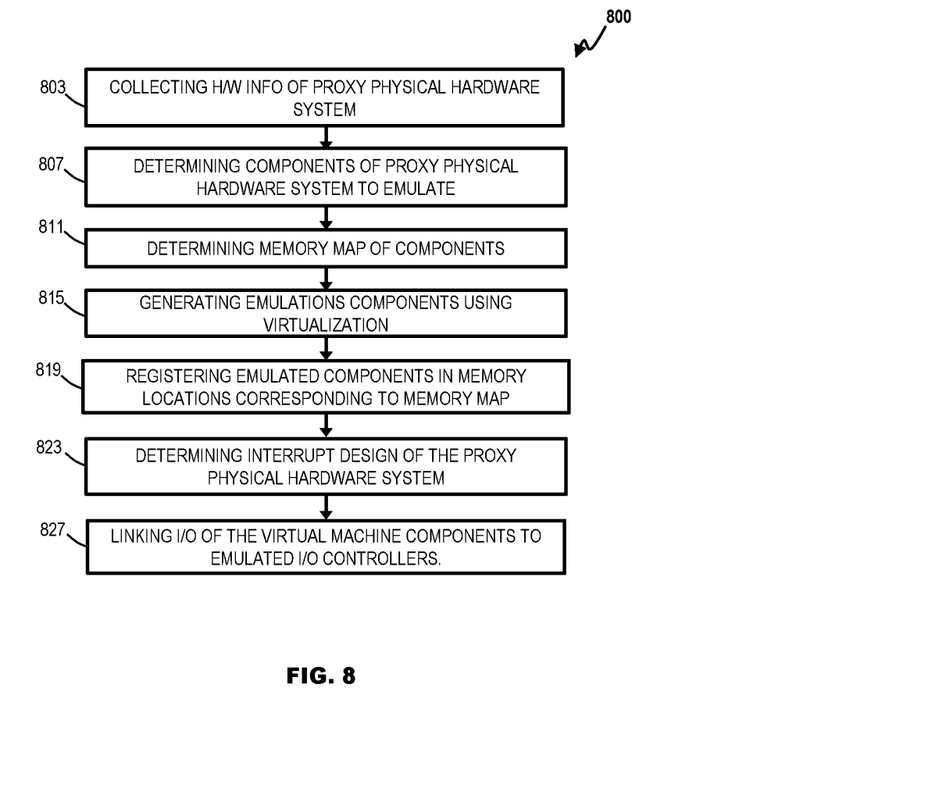
FIG. 8 illustrates a flow diagram of an exemplary process for constructing, in a virtualization system, a proxy virtual machine from a proxy physical hardware system in accordance with virtual machine construction aspects of the present disclosure.
Figure 9:
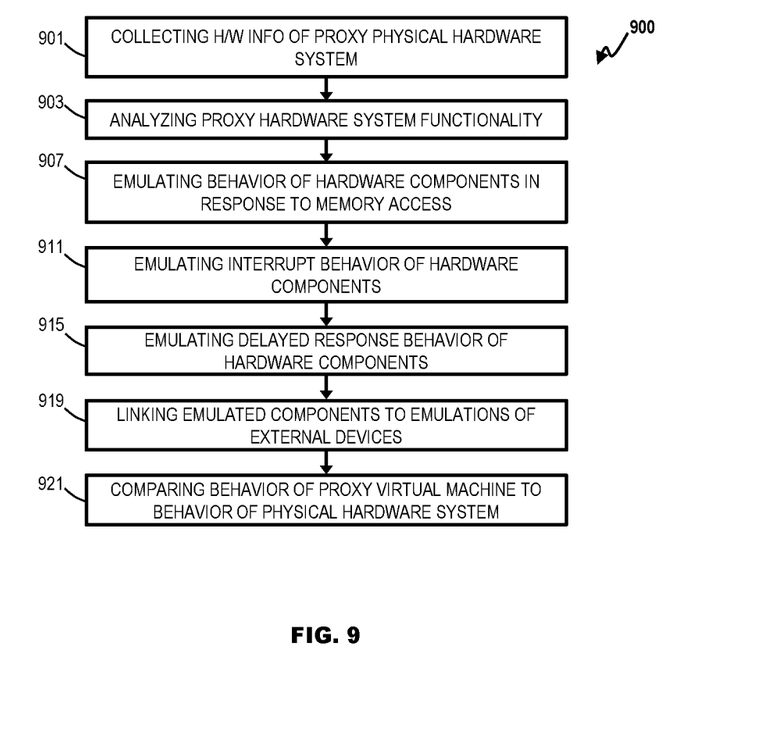
FIG. 9 illustrates a process flow diagram of an exemplary process for emulating components of a proxy physical hardware device in accordance an embodiment of the present disclosure.

The flow diagrams in FIGS. 7-9 illustrate examples of the functionality and operation of possible implementations of systems, methods, and computer program products according to various implementations consistent with the present disclosure. Each block in the flow diagrams of FIGS. 7-9 may represent a module, segment, or portion of program instructions, which includes one or more computer executable instructions for implementing the illustrated functions and operations. In some alternative implementations, the functions and/or operations illustrated in a particular block of the flow diagram can occur out of the order shown in FIGS. 7-9. For example, two blocks shown in succession can be executed substantially concurrently, or the blocks can sometimes be executed in the reverse order, depending upon the functionality involved. It will also be noted that each block of the flow diagram and combinations of blocks in the block can be implemented by, or using, special purpose hardware-based systems that perform the specified functions or acts, or combinations of special purpose hardware and computer instructions.

FIG. 7 illustrates a process flow diagram of an exemplary process 700 for testing a physical hardware system by executing hardware system application software on a corresponding emulated proxy physical hardware system in a proxy virtual machine. Block 701 includes obtaining a proxy physical hardware system (e.g., proxy physical hardware system 105) that matches aspects of a physical hardware system (e.g., physical hardware system 102) for which specifications and/or access is sometimes unavailable or limited. Block 703 includes constructing a virtual machine (e.g., proxy virtual machine 130) from a proxy physical hardware system (e.g., proxy physical hardware system 105) using a virtualization system (e.g., computing device 503 executing virtualization software (e.g. virtualization application 551) e.g., as shown and described below in reference to FIG. 8. For example, a user (e.g., developer) can execute program code (e.g., hardware system application software 136) from the physical hardware system 102 on the virtualization system 110. Block 705 includes emulating the hardware components of proxy physical hardware system in the virtual machine constructed at 703, e.g., as shown and described below with regard to FIG. 9. The virtual machine constructed at 703 and/or the hardware components emulated at 705 can be stored (in, e.g., device library 523) for future reference and use in other implementations (e.g., other virtual machines including one or more of the hardware components). Block 707 includes executing a hardware abstraction software layer, such as ARINC 653, in the proxy virtual machine.

Block 709 includes executing hardware system application software in the proxy virtual machine constructed at 703 using the hardware components emulated at 705. The executing can include, at 711, using a memory map that reproduces memory locations used by the proxy physical hardware system. This may include configuring the address space of a virtualization machine (e.g., proxy virtual machine 130) using a memory map (e.g., memory map 601) to match the address space of the proxy physical hardware system and/or the emulated hardware components. The executing of 709 can also include exchanging information among the virtual machine and/or the emulated hardware components via registering memory locations configured at 711 using the memory map. For example, the memory addresses and ranges for memory registers of the physical hardware system and hardware components can be registered with the virtual machine, and used to implement the functionality of each memory register found for the virtual machine and the emulated hardware components. By doing so, the virtual machine and the emulated hardware components can communicate via the memory constructs of the virtual machine by reading and writing information in the same manner as the hardware components of the physical hardware system. The executing of 709 can also include, at 715, using at least one adapter that maps data between the proxy virtual machine and the hardware system application software. Such mapping may be performed using physical to proxy adapter software (e.g., physical to proxy adapter software 134 and/or physical to proxy adapter software 135). Such physical to proxy adapter software may execute in a hardware abstraction software layer to map input/output messages, as shown and described above in reference to FIG. 1. Alternately, or in addition, such physical to proxy adapter software may execute in a proxy virtual machine to translate messages intended for different hardware abstraction layer software as shown and described above in reference to FIG. 2.

Block 719 includes testing, using the virtualization system, the physical hardware system. More particularly, the virtualization system performs testing (e.g., test and evaluation) of the physical hardware system 102 and/or the hardware components using the virtual machine. The test and evaluation can include software debugging, operational testing, integration testing, cybersecurity testing, and so on. Block 723 includes the developer modifying at least one of the hardware system application software and/or the physical hardware system 102 based on the test and evaluation performed at 719. Block 727 includes deploying the modifications of the hardware system application software and/or the physical hardware system. For example, modified software can be deployed to fielded production units of the physical hardware system. Additionally, modifications to hardware and/or software can be fed back into the design of simulations, pre-production units, or prototypes of the physical hardware.

FIG. 8 illustrates a flow diagram of an exemplary process for constructing 800, in a virtualization system, a proxy virtual machine from a proxy physical hardware system in accordance with virtual machine construction aspects of the present disclosure. Block 803 includes collecting hardware information of a proxy physical hardware system to be emulated (e.g., proxy physical hardware system 105). The information may be collected by a developer. The information collected at 803 can include specifications of hardware components and functional descriptions describing the configuration of memory registers, hardware block diagrams, system architecture of the physical hardware system, memory maps, interrupt connections, board support packages, and the like. Additionally, the developer can collect information regarding the software of the proxy physical hardware system. In some implementations, collecting the software information includes decompiling or disassembling code stored on the physical hardware system.

Block 807 includes determining components of the proxy physical hardware system to emulate based on the information collected at 803. In implementations, the developer identifies hardware components of the proxy physical hardware system that are not visible on the system memory map and thus are not directly accessible to software and are not necessarily required for emulation. For example, cache memory or a bridge that is not visible via a memory map of the physical hardware system (e.g., memory map 601) may not be emulated.

Block 811 includes the developer determining the memory map of the components determined at 807 using the information collected at 803, in a same or similar manner to that described previously herein (e.g., FIG. 6). The memory map indicates the components of the proxy physical hardware system and their corresponding locations in the memory of the proxy physical hardware system. Analyzing the memory map can include identifying memory devices and/or storage devices of the proxy physical hardware system, hardware devices of the proxy physical hardware system (e.g., input/output controllers, timers, bridges, interrupt controllers, block devices, control registers, etc.)

Block 815 includes generating emulations of the components determined at 807 using virtualization software (e.g., virtualization application 551). Block 819 includes registering emulated components (per block 815) in memory locations corresponding to the memory map memory map determined at 811. For example, the developer can apportion a region (e.g., memory space 605) to the virtual machine (e.g., proxy virtual machine 130) representing the proxy physical hardware system, and assign the emulated components to blocks (e.g., in address space 602) within the region, as previously described herein with regard to FIG. 6.

Block 823 includes the developer determining the interrupt design of the proxy physical hardware system using the information collected at 803. For example, the developer identifies hardware components that use interrupts and determines interrupt connections between hardware components and the interrupt controller. Additionally, hardware schematics showing wiring between input/output controllers and interrupt controller can be used to establish interrupt connectivity for the virtual machine by tracing interrupt lines traced in a schematic to other hardware components. Alternatively, the software in a board support package or device driver for the proxy physical hardware system 105 can be used to determine interrupt connectivity. Doing so allows identification of interrupts for different components of the proxy physical hardware system. Block 827 includes the developer linking input/output of the virtual machine components (block 815) to emulated input/output controllers. As an example, Ethernet controllers in the virtual machine can be connected to virtual network interface cards (NIC) (e.g., TAP Devices, etc.).

FIG. 9 is a flow diagram of a process for emulating (900), using a virtualization system, hardware components of a proxy physical hardware system in a proxy virtual machine in accordance with an embodiment of the present disclosure. Block 901 includes a developer collecting hardware information of the proxy physical hardware system to be emulated (e.g., proxy physical hardware system 105). The information can be the same or similar to that previously described herein (e.g., FIG. 8, 803). Block 903 includes the developer analyzing proxy hardware system functionality based on the information collected at 901. For example, the developer can analyze documentation (e.g., documentation 147) and identify hardware registers, interrupt functionality, delayed responses (e.g., using virtual machine virtual timers), and external virtual machine connectivity (virtual NICs, virtual ARINC 429, etc.).

Block 907 includes, in the virtual machine, emulating behavior of hardware components in response to memory access. Such emulation may include emulating a processor of the proxy physical hardware system, e.g., if the processor of the virtualization system differs from the processor of the proxy virtual machine. Block 911 includes the virtual machine emulating interrupt behaviors of the hardware components. Block 915 includes emulating delayed response behavior of hardware components. For example, memory access to a hardware component register may cause a device register to be modified to cause a specified behavior or an interrupt can be signaled to a hardware component to cause an activity to occur. In some cases of transmission by an Ethernet controller, a packet for transmission over Ethernet may be queued for transmission by writing it to a memory location. Doing so may trigger an interrupt to the Ethernet Controller by the system software to cause the Ethernet packet to be sent from the virtual machine. In the some cases of an Ethernet reception, the packet will arrive at the virtual machine from an external device, e.g. a virtual NIC, this packet will be stored in an internal queue and then in some instances this packet will be transferred to system RAM using a direct memory access engine to transfer the Ethernet packet from the Ethernet Controller internal memory to system RAM, after the transfer is complete an interrupt will be signaled from the Ethernet Controller to let the system software know that an Ethernet packet has arrived and is available in system memory. For example, the delayed responses may emulate a given baud rate on an interface by varying the speed of serial data. Block 919 includes linking the emulated components to emulations of external devices. That is, block 919 includes linking the virtual machine to one or more emulated devices external to the proxy physical hardware system. For example, a link may be created between external input/output of the emulated devices and an emulation of a network device with which the hardware components may communicate with in the proxy physical hardware system. Block 921 includes comparing the behavior of the proxy virtual machine to the behavior of the physical hardware system. Successful execution of the physical hardware system application software is a good measure of success for the proxy virtual machine and physical to proxy adapter software located in the proxy virtual machine layer, hardware abstraction software layer, or both.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of testing a physical hardware system by executing hardware system application software on a corresponding emulated proxy physical hardware system in a proxy virtual machine, the method comprising:
   selecting a proxy physical hardware system that matches aspects of the physical hardware system;
   constructing, in a virtualization system, the proxy virtual machine from the proxy physical hardware system;
   emulating, using the virtualization system, hardware components of the proxy physical hardware system in the proxy virtual machine;

executing a hardware abstraction software layer in the proxy virtual machine;

executing, by the hardware abstraction software layer of the virtualization system, the hardware system application software in the proxy virtual machine using a memory map that reproduces memory locations used by the proxy physical hardware system and using at least one adapter that adapts differences in the physical hardware system as compared to the proxy physical hardware system, wherein the adapter maps data between the proxy virtual machine and the hardware system application software; and testing, using the virtualization system, the physical hardware system by the executing the hardware system application software in the proxy virtual machine.

2. The method of claim 1, wherein the hardware abstraction software layer comprises an ARINC 653 operating system.

3. The method of claim 1, wherein the at least one adapter executes in the hardware abstraction software layer.

4. The method of claim 1, wherein the at least one adapter executes in the proxy virtual machine.

5. The method of claim 1, wherein the at least one adapter comprises a first adapter that executes in the software abstraction layer and a second adapter that executes in the proxy virtual machine.

6. The method of claim 1, wherein the physical hardware system comprises an avionics system comprising a plurality of line replaceable units.

7. The method of claim 1, further comprising:
modifying the physical hardware system based on the testing to produce a modified physical hardware system; and
deploying the modified physical hardware system.

8. The method of claim 1, wherein the obtaining the proxy physical hardware system that matches the physical hardware system comprises obtaining a proxy physical hardware system that has at least a same processor as a processor of the physical hardware system.

9. The method of claim 1, wherein the constructing, in the virtualization system, the proxy virtual machine from the proxy physical hardware system comprises emulating at least a processor of the proxy physical hardware system.

10. The method of claim 1, wherein the obtaining the proxy physical hardware system that matches the physical hardware system proceeds without access to a specification of the physical hardware system.

11. The method of claim 1, further comprising simulating at least one vehicle physical hardware system using the virtualization system to train users of the vehicle physical hardware system.

12. A system for testing a physical hardware system by executing hardware system application software on a corresponding emulated proxy physical hardware system in a proxy virtual machine, the system comprising:
a proxy physical hardware system selected to match aspects of the physical hardware system; and
a virtualization system comprising a proxy virtual machine constructed from the proxy physical hardware system, wherein the proxy virtual machine emulates hardware components of the proxy physical hardware system and executes a hardware abstraction software layer that executes the hardware system application software in the proxy virtual machine using a memory map that reproduces memory locations used by the proxy physical hardware system and using at least one adapter that adapts differences in the physical hardware system as compared to the proxy physical hardware system, wherein the adapter maps data between the proxy virtual machine and the hardware system application software.

13. The system of claim 12, wherein the hardware abstraction software layer comprises an ARINC 653 operating system.

14. The system of claim 12, wherein the at least one adapter executes in the hardware abstraction software layer.

15. The system of claim 12, wherein the at least one adapter executes in the proxy virtual machine.

16. The system of claim 12, wherein the at least one adapter comprises a first adapter that executes in the software abstraction layer and a second adapter that executes in the proxy virtual machine.

17. The system of claim 12, wherein the physical hardware system comprises an avionics system comprising a plurality of line replaceable units.

18. The system of claim 12, further comprising a modified physical hardware system modified based on testing the physical hardware system using the virtualization system.

19. The system of claim 12, wherein the proxy physical hardware system has at least a same processor as a processor of the physical hardware system.

20. The system of claim 12, wherein the proxy virtual machine constructed from the proxy physical hardware system emulates at least a processor of the proxy physical hardware system.

21. A method of training a person to operate a physical hardware system by training the person to operate executing hardware system application software on an emulated proxy physical hardware system in a proxy virtual machine, the emulated proxy physical hardware system corresponding to the physical hardware system, the method comprising:
selecting a proxy physical hardware system that matches aspects of the physical hardware system;
constructing, in a virtualization system, the proxy virtual machine from the proxy physical hardware system;
emulating, using the virtualization system, hardware components of the proxy physical hardware system in the proxy virtual machine;
executing a hardware abstraction software layer in the proxy virtual machine;
executing, by the hardware abstraction software layer of the virtualization system, the hardware system application software in the proxy virtual machine using a memory map that reproduces memory locations used by the proxy physical hardware system and using at least one adapter that adapts differences in the physical hardware system as compared to the proxy physical hardware system, wherein the adapter maps data between the proxy virtual machine and the hardware system application software; and
training the person, using the virtualization system, to operate the physical hardware system by training the person to operate the executing the hardware system application software in the proxy virtual machine.

22. The method of claim 21, wherein the physical hardware system comprises a vehicle physical hardware system.

23. The method of claim 22, wherein the vehicle comprises an aircraft, and wherein the virtualization system comprises a flight simulator.

* * * * *